United States Patent

[11] 3,626,211

[72] Inventor Richard B. Formeister
Phoenix, Ariz.

[21] Appl. No. 98,519
[22] Filed Dec. 16, 1970
[45] Patented Dec. 7, 1971
[73] Assignee Sperry Rand Corporation

[54] PULSE MODULATOR
11 Claims, 3 Drawing Figs.

[52] U.S. Cl. ........ 307/270, 307/237, 307/255, 307/264, 307/313, 328/59, 328/175
[51] Int. Cl. ........ H03k 1/14, H03k 5/08, H03k 6/02
[50] Field of Search ........ 307/254, 255, 260, 264, 270, 315, 313, 297, 237; 328/59, 67

[56] References Cited

UNITED STATES PATENTS

| | | | |
|---|---|---|---|
| 3,086,163 | 4/1963 | Francois | 307/313 X |
| 3,109,982 | 11/1963 | Anderson | 307/297 X |
| 3,168,709 | 2/1965 | Sikorra | 307/313 X |
| 3,235,787 | 2/1966 | Gordon | 307/255 X |
| 3,280,374 | 10/1966 | McCartney et al. | 307/315 X |
| 3,473,047 | 10/1969 | Bohn et al. | 307/237 X |
| 3,515,899 | 6/1970 | May | 307/237 X |
| 3,555,366 | 1/1971 | Brown | 307/254 X |

*Primary Examiner*—Donald D. Forrer
*Assistant Examiner*—L. N. Anagnos
*Attorney*—S. C. Yeaton ABSTRACT: High-speed high-current low-voltage elements are used to generate high-speed high-current pulses having an amplitude approaching twice the breakdown voltage rating of the active elements. A plurality of circuits may be stacked to provide absolute pulse amplitudes that are multiples of the active element breakdown voltage rating. The circuit may also be prebiased at a level independent of the active element voltage rating.

INVENTOR
RICHARD B. FORMEISTER
BY
HP Terry
ATTORNEY

INVENTOR
RICHARD B. FORMEISTER
BY
H P Terry
ATTORNEY

PULSE MODULATOR

BACKGROUND OF THE INVENTION

1. Field of the Invention

The invention relates to pulse generating techniques where high power fast rise time short duration pluses are desired. In particular, the invention may be used as a high speed pulse modulator having active element ratings at approximately half of the output pulse voltage amplitude.

2. Description of the Prior Art

Priorly, high voltage amplitude pulse generating circuits required thyristors or pulse transformers coupled with pulse shaping circuitry and were necessarily elaborate and expensive. The devices used in these circuits required high voltage ratings equivalent to or exceeding the parameters of the output pulses. As high voltage devices have somewhat inversely related operating speeds, the minimum rise times of the output pulses was limited.

SUMMARY OF THE INVENTION

An input pulse triggering the pulse generator circuit is duplicated in time but of greater amplitude due to the particular use of high speed high current low voltage active elements and pulse shaping techniques are unnecessary. The circuit permits the generated pulses to have voltage of the active elements. A plurality of the basic circuits may be stacked to provide output pulse amplitudes approaching the supply voltage without damaging the active elements where their breakdown voltage is equal to the supply voltage divided by the number of stacked stages times one-half.

A primary object of the invention is to provide high speed high voltage high power output pulses using high speed high current low-voltage active elements.

Another object of the invention is to provide a high power gain pulse modulator.

Another object of the invention is to provide a low cost pulse modulator.

Another object of the invention is to provide a pulse modulator having an output power capability greater than that of the individual active elements.

Another object of the invention is to provide a pulse modulator adaptable to a plurality of power output ranges by simply stacking a plurality of the basic circuits and maintaining the integrity of the low power low cost active elements.

Another object of the invention is to provide a pulse modulator having a prebiased pulse output without influencing available pulse amplitude.

Another object of the invention is to provide a high speed pulse modulator capable of high speed current limiting in the case of excessive or variable load requirements.

DETAILED DESCRIPTION OF THE INVENTION

Figure 1:
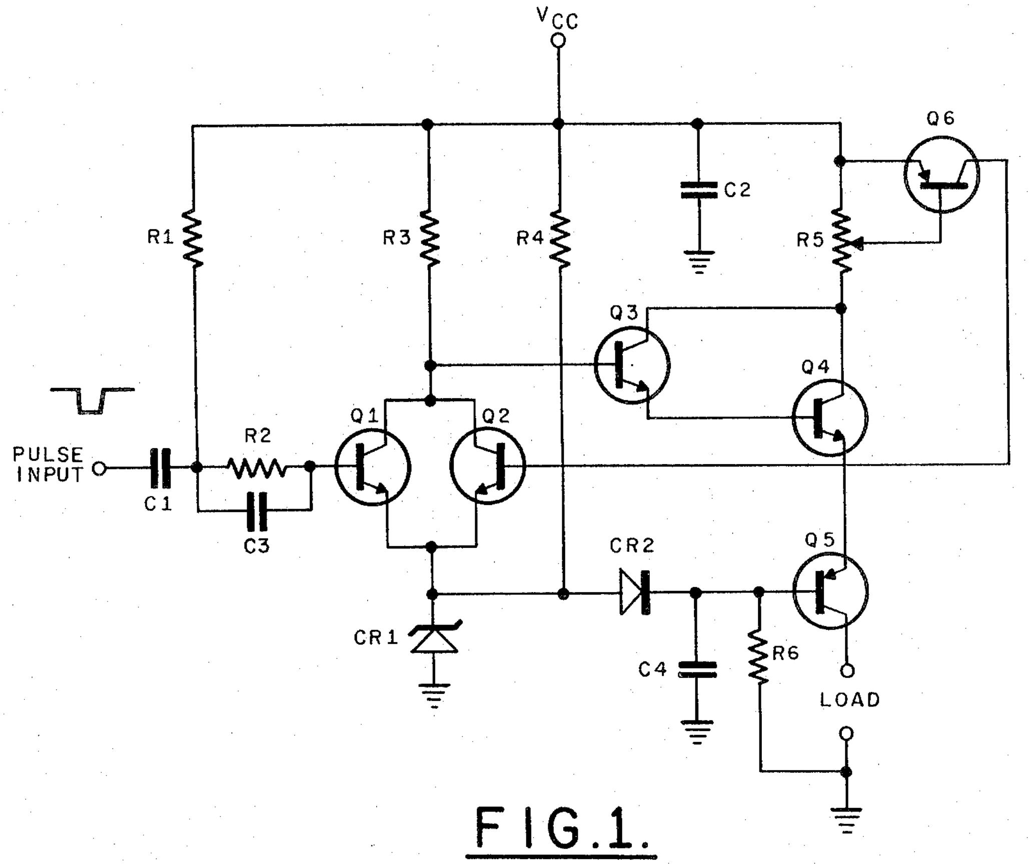
FIG. 1 illustrates the basic circuit for generating the output pulses.

In the following discussion of the invention illustrated in the drawings, the term transistors will be used to describe an active element and drawn as a transistor. It is to be understood however, that the term active element might just as easily have been used and thereby embrace other devices presently known or unknown which may perform the same function. Referring to FIG. 1, the circuit will first be described in the absence of a pulse input. The resistor R1 is selected to bias transistor Q1 into saturation. Transistor Q1 may be referred to as a driver or a switch. The Zener diode CR1, or voltage pedestal, is biased through resistor R4 to provide one-half of the supply voltage, $V_{cc}/2$, at the junction of the emitters of transistors Q1 and Q2. The voltage at the collector of transistor Q1 is then one-half of the supply voltage plus the collector-emitter saturation voltage drop across Q1, e.g., $V_{cc}/2+Vq1$ sat. The voltage at the base of transistor Q5 is one-half of the supply voltage less the voltage drop through the clamp, diode CR2, e.g., $V_{cc}/2-V_D$. The potential difference between the collector of transistor Q1 and the base of transistor Q5 then becomes, $V_{cc}/2+V_{Q1}$ sat-$(V_{cc}/2-V_D)$, or $V_{Q1}$ sat$+V_D$ The nominal collector-emitter voltage across a saturated silicon transistor is 0.3 v. and the nominal forward voltage drop across a silicon diode is 0.6 v. and the potential difference between the collector of Q1 and the base of transistor Q5 is therefore nominally 0.9 v. Since the voltage between the collector of transistor Q1 and the base of transistor Q5 required to turn on the three silicon transistors Q3, Q4, and Q5 is nominally 0.6 v. per base-emitter junction, or 1.8 v. total, transistor Q5 is biased off and no current will flow in the base of transistor Q5. With no base current flow, there is no collector current flow in transistor Q5, and the voltage across the load is zero because the current flow into the load is zero. By inspection, it can then be seen that the potential across any two terminals of the transistors Q1 to Q6 is approximately one-half of the supply voltage, $V_{cc}/2$. Thereby the breakdown voltage (such as $BV_{ceo}$) of the transistors need only be that of half of the supply voltage.

In operation, a negative input pulse is applied through coupling capacitor C1 to the base of transistor Q1. Transistor Q1 turns off and the voltage at the base of transistor Q3 is the supply voltage less the voltage drop across the common pullup resistor R3, ($V_{BQ3}=V_{cc}-I_{BQ3}\cdot R3$). The potential difference between the base of transistor Q3 and the base of transistor Q5 now becomes $V_{cc}-I_{BQ3}\cdot R3-(3\times0.6)=V_{cc}-I_{BQ3}\cdot R3-1.8$ v. The diode CR2 is thusly reverse biased. The resistor R6 is selected such as to draw sufficient current to saturate transistors Q4 and Q5 at designed load. The voltage across the load is then the supply voltage less the emitter-base voltage drop across transistors Q3 and Q4 and less than the saturation drop across transistor Q5, e.g., $V_L=V_{cc}-2\times0.6-0.3\cong V_{cc}-1.5$ v. Inspection of the circuit will again reveal that the potential across any two terminals of transistors Q1–Q6 is less than approximately one-half of the supply voltage in the presence of an input pulse.

The combination of transistors Q3, Q4, and Q5 may be considered collectively as a four terminal amplifier. As such, the collectors of transistors Q3 and Q4 may be termed the first terminal connected to the power source. The base of transistor Q3 may be termed the second terminal and comprising the input. The base of transistor Q5 may be termed the third terminal for providing internal protection. The collector of transistor Q5 may be termed the fourth terminal and connected to the load.

If desired, the input pulse may be used to vary the amplitude of the output pulse between the limits of approximately $V_{cc}$ and $V_{cc}/2$ (where the approximation is due to the inherent voltage drops within the circuit). This may be accomplished by varying the conductivity of transistor Q1 and thereby vary the current through resistor R3 in response to the input signal. Bias resistor R1 may have to be adjusted in respect to the expected input pulse amplitude variation.

Under heavy load current conditions a current limiter is required to prevent damage to the circuit elements. Transistor Q6, with the emitter connected to the supply voltage, the base connected to a variable potentiometer R5 and the collector connected to the base of Q2, serves as a current sensor. The potentiometer R5 is adjusted such that the load current ($I_l$) times the selected resistance equals the voltage (0.6 v.) required to turn on transistor Q6. In turn, current will flow in the base of transistor Q2 and it turns on. Collector current flow in transistor Q2 reduces the potential at the base of Q3 by the amount $I_{CQ2}\cdot R3$, and transistor Q2 may be termed a current limiter amplifier. Consequently, the load voltage is reduced and the load current is effectively limited. The addition of resistor R5 necessarily reduces the load voltage by the amount of load current times resistor R5 but this is typically not more than a volt. Thus the load voltage which may be further reduced by turning Q2 on may be expressed as $V_L = V_{cc} - KI_LR5 - V_{D(Q3)} - V_{D(Q4)} - V_{Q5\ sat}$, where $K$ is a constant dependent on devices chosen. The limiter is high speed because a small change in current across the base and emitter of transistor Q6 is amplified, Causing a rapid turn on of transistor Q2. Base current in transistor Q2 is amplified thereby increasing the voltage across resistor R3 and rapidly limiting the load voltage.

The state of development in the art of active elements dictates that transistors Q3 and Q4 be connected as a Darlington amplifier for the following reasons. Presently, there are available transistors having a 2 ampere output with breakdown voltage of 40 volts and a minimum beta ($\beta = I_C/I_B$) of 20. Thus, for reasons stated above, the supply voltage is limited to 80 volts and the transistor base current should not exceed 100 milliamperes. If Q3 and Q4 were replaced by a single active element, the current output, 2 amperes, would still remain the same, however the voltage at the base of the transistor would be the supply voltage less the base current times the resistance of resistor R3 and less the other miscellaneous voltage drops, $V_L = V_{cc} - I_{BQ3} \cdot R3 - V_{misc}$. With the Darlington amplifier arrangement, the base current of transistor Q4 would still be 100 ma. but the base current of transistor Q3 is reduced to 5 ma. and the voltage drop across resistor R3 is reduced by a factor of 20 or $V_L = V_{cc} - 1/20\ (I_{BQ3} \cdot R3) - V_{misc}$. As further development of active elements may provide high speed, high current, high gain low-voltage devices which might obviate the need for a Darlington configuration, and yet embrace the teaching of the instant invention, it is not intended that the circuit be limited to include a Darlington amplifier. The basic requirement is, in essence, a device which provides the necessary current gain as Q4 without reducing the base voltage at transistor Q5 by increasing the voltage drop across resistor R3.

One of the objects of the invention is to provide a stable high gain pulse modulator. A circuit built according to the invention typically has an input signal of 2 volts at an impedance level of 300 ohms with an output signal of 2 amperes at 80 volts. The gain of the circuit may be computed where $$A = \frac{\text{Output}}{\text{Input}} = \frac{VI}{E2/R}$$

$$A = \frac{160 \text{ watts}}{4/300 \text{ watts}} = 12{,}000$$

Aside from providing a gain of 12,000, the circuit is also unconditionally stable over a wide frequency range. The above values are intended to be representative of the capability of the circuit and are not to be considered as absolutes. Selection of components having different values, or not yet commercially available, may provide even more attractive figures.

As one of the objects of the invention is to minimize the cost of a pulse modulator, a substantial saving can be effected by reducing the power requirements of the power supply. The addition of capacitor C2 provides the high peak currents required when the circuit is turned on by the input pulse. The selection of the value of the capacitor C2 is well known to those skilled in the art and will not be described herein.

Figure 2:
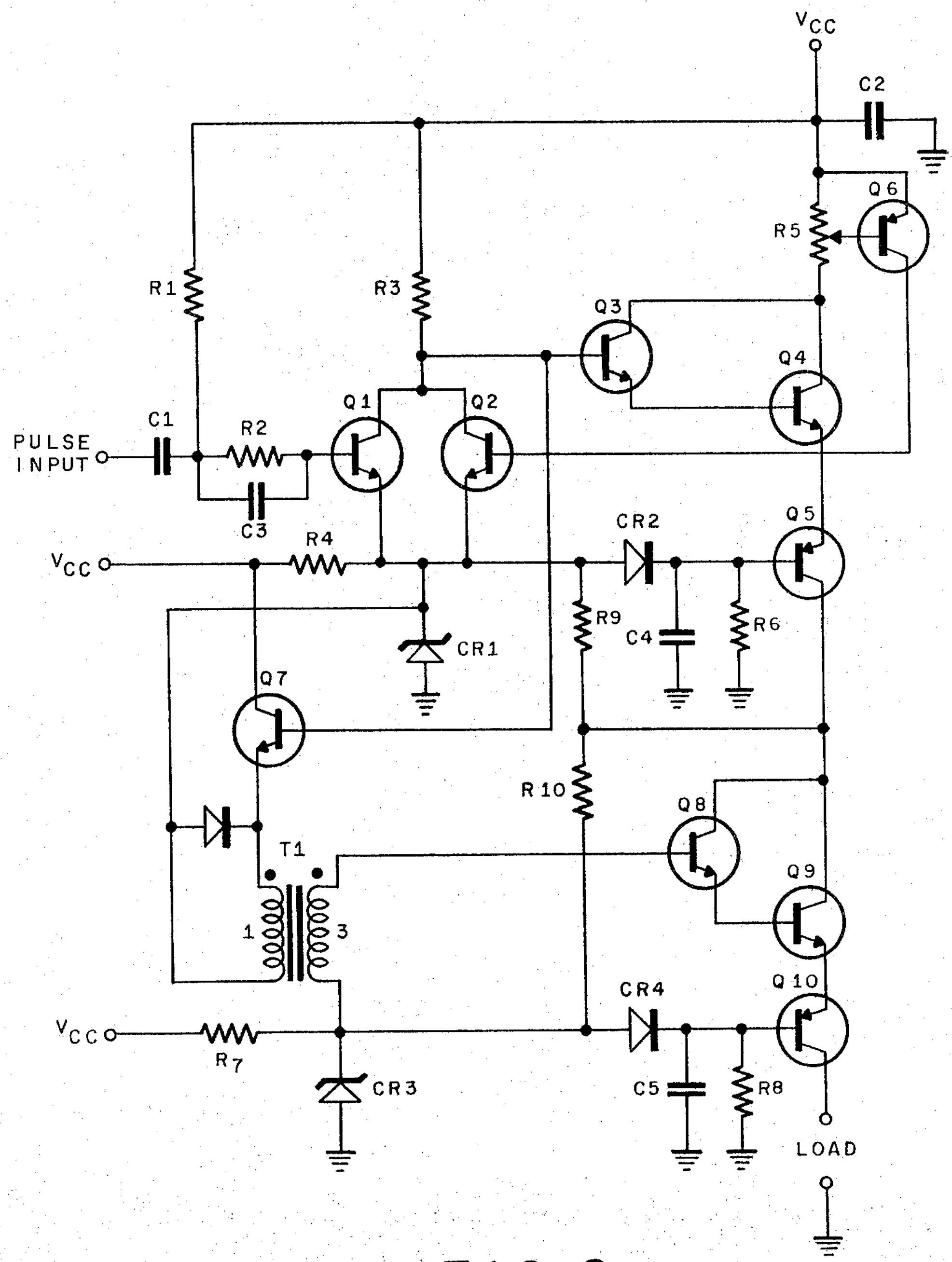
FIG. 2 illustrates the basic circuit in a stacked configuration.

FIG. 2 illustrates a modification of the basic invention. A plurality of the basic circuits are stacked to provide output pulse amplitudes approaching that of the supply voltage where the supply voltage is greater than the breakdown voltage of the active elements as a factor of 4. Although not shown, additional circuits may be stacked to provide pulses with even greater multiples of the breakdown voltage of the active elements.

For the sake of simplicity, the identifying scheme employed in respect to FIG. 1 will be used in FIG. 2 of common elements having the same function. Zener diode CR1 is biased through resistor R4 at three-fourths of the supply voltage (.75 $V_{cc}$), assuming that the supply voltage is four times the breakdown voltage of the active elements. When transistor Q1 is on, the potential difference between the base of transistor Q5 (.75 $V_{cc}$-$V_d$) and the collector of transistor Q1 (.75 $V_{cc}$+$V_{sat}$) is insufficient to cause base current to flow in transistor Q5 for reasons stated earlier in respect to FIG. 1. Thus, no collector current flows in transistor Q5. Zener diode CR3, operating as a voltage pedestal, is biased through resistor R7 at one-fourth of the supply voltage (.25 $V_{cc}$). The potential at the base of transistor Q10 then becomes .25 $V_{cc}$ less the voltage drop ($V_d$) across diode CR4, a clamp. The potential difference between the base of transistor Q8 and the base of transistor Q10 is less than the base-emitter voltage drop across the three transistors Q8, Q9, and Q10 and they remain off. The balanced resistors R9 and R10 are selected to place the collectors of transistors Q5, Q8, and Q9 at one-half of the supply voltage (.5 $V_{cc}$) to force equal sharing of the supply voltage and thereby serve as a clamp. The emitter of the current buffer Q7, through the transformer T1 primary coil, is at three-fourths of the supply voltage (.5 $V_{cc}$) to force equal sharing of the supply voltage and thereby serve as a clamp. The emitter of the current buffer Q7, through the transformer T1 primary coil, is at three-fourths of the supply voltage (.75 $V_{cc}$). Its base is at .75 $V_{cc}$+$V_{Q1\ sat}$, and its collector is connected to the supply voltage ($V_{cc}$). By inspection, it is obvious that any two terminals of any active element is at approximately one-fourth of the supply voltage and within the breakdown voltage range during the no input pulse phase of operation.

On receipt of an input pulse through coupling capacitor C1, transistor Q1 turns off and the potential at its collector approaches the supply voltage for reasons discussed above. The potential at the base of transistor Q3 voltage and it is applied to the base of transistor Q7, turning transistor Q7 on. As the collector of transistor Q7 is connected to the supply voltage ($V_{cc}$), the potential across the primary of the transformer T1 is the supply voltage ($V_{cc}$) less the potential at Zener diode CR1, or, one-fourth of the supply voltage (.25 $V_{cc}$). The driver, transformer T1, is a one to three step up transformer and the voltage across the secondary of transformer T1 is three-fourths of the supply voltage (.75 $V_{cc}$). The reference level for the secondary coil is at one-fourth of the supply voltage (.25 $V_{cc}$), so the total potential at the base of transistor Q8 becomes approximately the supply voltage. The potential difference between the base of Q10 and the base of Q8 is now the base-emitter voltage drop for the three transistors Q8, Q9, and Q10 and all three turn on and diode CR4 is reverse biased. The potential at the collector of Q10 then becomes the supply voltage less the voltage drop across resistor R5 and the voltage drop across the saturated transistors Q4, Q5, Q9, and Q10. The resistors R6 and R8 insure that transistors Q5 and Q10, respectively, are saturated. As a simplification, transistors Q8, Q9, and Q10 may be considered as a four terminal amplifier having the same functional features as described in respect to the amplifier comprising transistors Q3, Q4, and Q5. By inspection, it is again obvious that the potential across any two terminals of any active element is less than one-fourth of the supply voltage and less than their breakdown voltage.

The circuit comprised of R2 and C3 in the input stage in FIG. 1 and 2 may be added to increase the rise time and reduce the storage time of the charge on transistor Q1.

Figure 3:
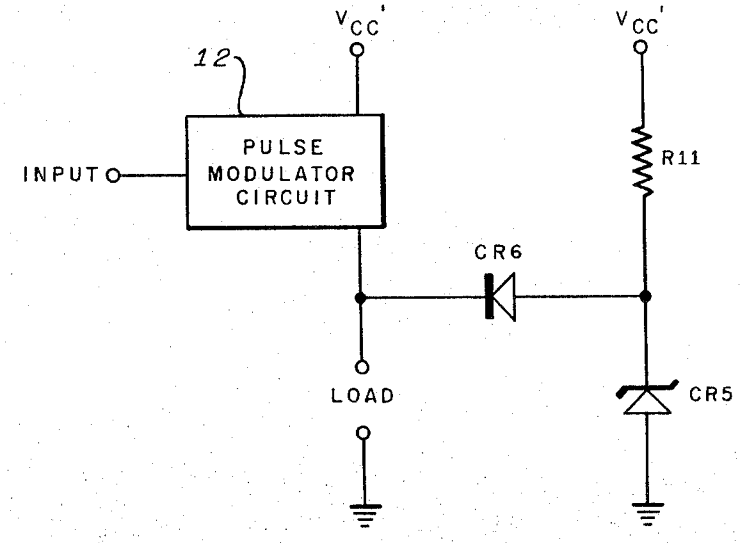
FIG. 3 illustrates the additional circuitry necessary to prebias the pulse modulator to a selected value.

Further advantage of the described pulse modulator is that the reference potential does not have to be at ground but may be at some other value. That is, the circuit may prebias prebiased and yet the potential across any two terminals of the active elements will not be subjected to a higher voltage than that occuring with the reference voltage at ground. Thus, the absolute value of the output pulse may be at a voltage higher than that of the pulse amplitude itself. By the addition of the elements shown in FIG. 3 comprising diode CR6, a clamp, Zener diode CR5, a voltage pedestal, supply voltage ($V_{cc}$) to unit 12 (representing the circuits of either FIG. 1 or 2), the pulse reference level and absolute height may be increased. If, for the circuits of either FIG. 1 or FIG. 2, $V_B$ represents the prebias level and $V_{cc}'$ represents the former supply voltage plus the prebias level ($V_{cc}'=V_{cc}+V_B$) the following modifications have to be made. For FIg. 1, the added diode CR5 is biased at $V_B$through resistor R11 and diode CR1 is biased through resistor R4 at 0.5 $V_{cc}+V_B$. For FIG. 2, diode CR5 is biased at $V_B$ through resistor R4. Diode CR1 is biased through R5 at 0.75 $V_{cc}+V_B$. Diode CR3 is biased through resistor R7 at 0.25 $V_{cc}+V_B$. By inspection, it can be determined that during either the presence or absence of an input pulse the potential across any two terminals of the active elements is maintained at less than the breakdown voltage Small capacitors C4 and C5 may be added to the base of transistors Q5 and Q10, respectively, to reduce the pulse fall time. If desired, the transformer T1 in FIG. 2 may be replaced by a thyristor, but the only advantage gained would be that of providing a circuit comprising only resistors, capacitors and semiconductors. As the state of the art progresses it is conceivable that a transistor will become available which could be used to replace the transformer T1 without additional complexity, but none are presently known.

While the invention has been described in its preferred embodiment, it is to be understood that the words which have been used are words of description rather than limitation and that changes within the purview of the appended claims may be made without departing from the true scope of the invention in its broader aspects.

1. A pulse modulator comprising
an input signal source,
means for establishing a first voltage pedestal,
a common pull-up resistor having one end connected to a power source,
a driver connected between said voltage pedestal means and the other end of said common pull-up resistor and responsive to said input signal,
clamp means connected to said pedestal means,
an amplifier having four terminals and including components having a breakdown voltage value less than the potential of the power source,
said amplifier having a first terminal connected to the power source, a second terminal connected to said other end of said common pull-up resistor and comprising the input terminal, a third terminal connected to said clamp means for providing internal protection to said amplifier, and a fourth terminal comprising an output terminal for providing an output signal having a potential approximately equal to the potential of the power source.

2. The apparatus as described in claim 1 wherein said amplifier comprises
a pair of transistors of a first polarity connected as a Darlington amplifier, wherein the collectors of said pair of transistors comprise said first terminal and the base of one of said pair of transistors comprises said second terminal,
A third transistor of a second polarity having its emitter connected to the emitter of another of said pair of transistors, wherein the base of said third transistor comprises said third terminal and the collector of said transistor comprises said fourth terminal.

3. The apparatus of claim 1 including
a current sensor responsive to the current at said first terminal of said amplifier,
a current limiter amplifier responsive to said current sensor for varying the potential of said other end of said common pull-up resistor whereby the current at said fourth terminal of said amplifier is limited.

4. The apparatus as claimed in claim 3 wherein said current sensor comprises
a potentiometer disposed between said first terminal and the power source,
a transistor of one polarity having its emitter connected to one side of said potentiometer, its base connected to the variable element of said potentiometer and its collector connected to said current limiter amplifier, and
wherein said current limiter amplifier comprises a transistor of another polarity having its base connected to said collector of said current sensor, its emitter connected to said pedestal means, and its collector connected to said other end of said pull-up resistor.

5. The apparatus of claim 1 including prebias circuitry comprising
a second means for establishing voltage pedestal,
further clamp means disposed between said second voltage pedestal means and said fourth terminal of said amplifier whereby the potential of said voltage pedestal means and the power source may be increased by an amount equal to the potential of said second voltage pedestal means.

6. The apparatus of claim 1 comprising a first stage and including a second stage, said second stage comprising
a driver having input and out connections with its input connected across said voltage pedestal means in said first stage and the power source,
a buffer disposed between the power source and one of said input connections of said driver,
means for establishing a voltage pedestal connected to one of said driver outputs,
a first clamp means connected to said voltage pedestal means,
a second clamp means disposed between said first stage and said second stage for isolating said first stage from said second stage in the absence of an input signal,
an amplifier having four terminals and including components having a breakdown voltage value of approximately one-fourth of the potential of the power source and
said amplifier having a first terminal connected to said fourth terminal of said amplifier in said first stage, a second terminal connected to another of said driver outputs, a third terminal connected to said first clamp means, and a fourth terminal comprising an output terminal for providing an output signal having a potential approximately equal to the potential of the power source.

7. The apparatus as described in claim 6 wherein said amplifier of said second stage comprises
a pair of transistors of a first polarity connected as a Darlington amplifier wherein the collectors of said pair of transistors comprise said first terminal of said second stage and the base of one of said pair of transistors comprises said second terminal of said second stage,
a third transistor of a second polarity having its emitter connected to the emitter of another of said pair of transistors, wherein the base of said third transistor comprises said third terminal of said second stage and the collector of said transistor comprises said fourth terminal of said second stage.

8. The apparatus described in claim 6 wherein
said driver of said second stage comprises a transformer having a 1 to 3 step up ratio, and
said buffer comprises a transistor having its base connected to said other end of said pull-up resistor, its emitter connected to said one input connection of said transformer, and its collector connected to the power source.

9. The apparatus described in claim 6 wherein said second clamp comprises
a three leg, two resistor voltage divider network having its junction point connected to said first terminal of said instant stage amplifier, one of said legs connected to said voltage pedestal means of said first stage and another of said legs connected to said voltage pedestal means of said second stage.

10. the apparatus of claim 6 including prebias circuitry comprising
a third means for establishing a voltage pedestal,
a third clamp means disposed between said third voltage pedestal means and said fourth terminal of said second stage, whereby the potential of said voltage pedestal means of said first stage, the potential of said voltage pedestal means of second stage and the potential of the power source may be increased by an amount equal to the potential of said third voltage pedestal means.

11. The apparatus of claim 1 comprising an initial stage and including a plurality of succeeding stages, each said succeeding stage comprising a driver having input and output connections with its input connected across the voltage pedestal means of a preceding stage and the power source, a means for establishing a voltage pedestal connected to one of said driver outputs, a first clamp means connected to said voltage pedestal means in the instant stage, a second clamp means disposing between the preceding stage and said instant stage for isolating said preceding stage from said instant stage in the absence of an input signal, an amplifier having four terminals and including components having a breakdown voltage of approximately one-half of the potential of the power source divided by the number of stages, said amplifier having a first terminal connected to the output of said preceding stage, a second terminal connected to another of said driver outputs, a third terminal connected to said first clamp means, and a fourth terminal comprising an output terminal for providing an output signal having a potential approximately equal to the potential of the power source.

* * * * *